United States Patent
Yamazaki

(10) Patent No.: US 10,518,479 B2
(45) Date of Patent: Dec. 31, 2019

(54) THREE-DIMENSIONAL OBJECT MODELING DEVICE, METHOD OF MOLDING THREE-DIMENSIONAL OBJECT, AND CONTROL PROGRAM FOR THREE-DIMENSIONAL OBJECT MODELING DEVICE

(71) Applicant: Seiko Epson Corporation, Tokyo (JP)

(72) Inventor: Satoshi Yamazaki, Matsumoto (JP)

(73) Assignee: Seiko Epson Corporation (JP)

( * ) Notice: Subject to any disclaimer, the term of this patent is extended or adjusted under 35 U.S.C. 154(b) by 130 days.

(21) Appl. No.: 15/898,713

(22) Filed: Feb. 19, 2018

(65) Prior Publication Data

US 2018/0281288 A1 Oct. 4, 2018

(30) Foreign Application Priority Data

Mar. 28, 2017 (JP) .................. 2017-062243

(51) Int. Cl.
| | |
|---|---|
| *B29C 64/393* | (2017.01) |
| *B29C 67/00* | (2017.01) |
| *B29C 64/112* | (2017.01) |
| *G05B 19/4099* | (2006.01) |
| *G06T 17/00* | (2006.01) |

(Continued)

(52) U.S. Cl.
CPC .......... *B29C 64/393* (2017.08); *B29C 64/112* (2017.08); *B29C 67/0007* (2013.01); *B33Y 10/00* (2014.12); *B33Y 30/00* (2014.12); *B33Y 50/02* (2014.12); *G05B 19/4099* (2013.01); *G06T 17/00* (2013.01); *B29K 2995/0021* (2013.01); *G05B 2219/49007* (2013.01); *G05B 2219/49008* (2013.01); *G06F 17/50* (2013.01)

(58) Field of Classification Search
None
See application file for complete search history.

(56) References Cited

U.S. PATENT DOCUMENTS

| | | |
|---|---|---|
| 2016/0129632 A1 | 5/2016 | Yamazaki |
| 2016/0129640 A1 | 5/2016 | Yamazaki |

(Continued)

FOREIGN PATENT DOCUMENTS

| | | |
|---|---|---|
| JP | 2006-264221 A | 10/2006 |
| JP | 2016-093912 A | 5/2016 |

(Continued)

*Primary Examiner* — Sean Shechtman
(74) *Attorney, Agent, or Firm* — Harness, Dickey & Pierce, P.L.C.

(57) ABSTRACT

A method of molding a three-dimensional object, the method including: generating modeling data for the three-dimensional object; determining a region to be modeled by layering the dot using the modeling ink based on the modeling data; determines a color region to be colored by discharge of the coloring ink on a surface of a set of the layered dot with the modeling ink, based on the modeling data to reduce a difference in depth in a normal direction of a surface of the three-dimensional object; generating modeling ink discharge data for discharging the modeling ink, and coloring ink discharge data for discharging the coloring ink; and causing the modeling ink and the coloring ink to be discharged in accordance the discharge data of the modeling ink and the coloring ink, and performing modeling and coloring of the three-dimensional object.

12 Claims, 9 Drawing Sheets

(51) Int. Cl.
  *B33Y 10/00*  (2015.01)
  *B33Y 30/00*  (2015.01)
  *B33Y 50/02*  (2015.01)
  *G06F 17/50*  (2006.01)

(56) References Cited

U.S. PATENT DOCUMENTS

2016/0129641 A1    5/2016  Yamazaki
2016/0243760 A1    8/2016  Utsunomiya et al.
2018/0036951 A1*   2/2018  Harayama ............. B29C 64/393
2018/0229447 A1*   8/2018  Mantell ................. B29C 64/112

FOREIGN PATENT DOCUMENTS

| JP | 2016-093913 A | 5/2016 |
| JP | 2016-093914 A | 5/2016 |
| JP | 2016-150457 A | 8/2016 |
| JP | 2016-150549 A | 8/2016 |
| JP | 2016-150550 A | 8/2016 |
| JP | 2016-150551 A | 8/2016 |
| JP | 2016-150553 A | 8/2016 |
| WO | WO-2016-132670 A | 8/2016 |
| WO | WO-2016-132672 A | 8/2016 |

* cited by examiner

THREE-DIMENSIONAL OBJECT MODELING DEVICE, METHOD OF MOLDING THREE-DIMENSIONAL OBJECT, AND CONTROL PROGRAM FOR THREE-DIMENSIONAL OBJECT MODELING DEVICE

BACKGROUND

1. Technical Field

The present invention relates to a modeling technique for a three-dimensional object.

2. Related Art

Three-dimensional (3D) printers are known as three-dimensional object modeling devices. The three-dimensional (3D) printer described in JP-A-2016-93913 discharges ink, forms a layered model body with dots formed by the discharged ink, and layers the layered model body, thereby modeling a three-dimensional object. An ink layer is formed by coloring ink on the surface of the three-dimensional object.

In a 3D printer, the shape of dots that form an ink layer is not necessarily a cubic shape, and thus there is a problem in that a difference in color density is increased depending on a direction of viewing a three-dimensional object even with the same amount of ink.

SUMMARY

An advantage of some aspects of the invention is that the above-mentioned problem can be coped with, and the invention may be may be implemented according to one of the following aspects.

(1) In an aspect of the invention, there is provided a three-dimensional object modeling device that uses ink which is solidified after being discharged and becomes part of a three-dimensional object as a three-dimensional dot. The three-dimensional object modeling device includes: a first nozzle that allows a modeling ink in the ink to be discharged, the modeling ink being used for modeling the three-dimensional object; a second nozzle that allows a coloring ink in the ink to be discharged, the coloring ink being used for coloring the three-dimensional object; a model data generator that generates modeling data for the three-dimensional object; a model region determiner that determines a region to be modeled by layering the dot using the modeling ink discharged through the first nozzle, based on the modeling data; a color region determiner that determines a color region to be colored by discharge of the coloring ink using the second nozzle, on a surface of a set of the layered dot with the modeling ink, based on the modeling data to reduce a difference in depth in a normal direction of a surface of the three-dimensional object; a discharge data generator that generates modeling ink discharge data for discharging the modeling ink, and coloring ink discharge data for discharging the coloring ink; and a processing controller that causes the modeling ink and the coloring ink to be discharged though the first and second nozzles, respectively in accordance the discharge data of the modeling ink and the coloring ink. According to the aspect, a color region to be colored by discharge of the coloring ink is determined to reduce a difference in depth in a normal direction of a surface of the three-dimensional object, thus a variation in color density can be reduced even when the direction of viewing the three-dimensional object is varied.

(2) In the aspect, the color region determiner may set a uniform variation in a depth from a surface of the color region. When a variation in a depth from the surface of the color region is uniform, the difference in depth in a normal direction of the surface of the three-dimensional object can be reduced.

(3) In the aspect, the discharge data generator may identify the number of dots in the coloring ink discharged to the color region in the length, width, and height directions based on a three-dimensional shape of the dot after the coloring ink is solidified, and may generate discharge data of the coloring ink to be discharged for each of layers. According to the aspect, the depth from the surface of the color region can be determined by the number of dots in the coloring ink in the length, width, and height directions, thus the color region can be easily determined.

(4) In the aspect, the color region determiner may determine the depth from the surface of the color region in terms of the number of dots which is inversely proportional to a magnitude of each of terms in an integer ratio by which the length, width, and height as the dot size of the dot formed by using the coloring are approximated. According to the aspect, the color region determiner determines the depth from the surface of the color region in terms of the number of dots which is inversely proportional to a magnitude of each of terms in an integer ratio by which the length, width, and height as the dot size of the dot formed by using the coloring are approximated, thus the depth from the surface of the color region can be made close to a uniform value regardless of the shape of the dot.

(5) In the aspect, the color region determiner may determine the number of dots according to a value obtained by dividing the least common multiple of the terms in the integer ratio by each term in the integer ratio. According to the aspect, the color region determiner can easily calculate the number of dots corresponding to the depth from the surface of the color region.

The invention can be implemented in various aspects, and for instance, can be implemented as a method of modeling a three-dimensional object, and a control program for a three-dimensional object modeling device in addition to a three-dimensional object modeling device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment for carrying out the invention will be described with reference to the drawings. However, in each drawing, the dimensions and scale of each component are made different from actual ones as needed. Also, the embodiments described below are preferred specific examples, and thus technically preferable various limitations are imposed. However, the scope of the invention is not limited to those embodiments unless particularly described to limit the invention in the following description.

In this embodiment, an ink jet three-dimensional object modeling device, which discharges curable ink (an example of "liquid") such as resin ink containing a resin emulsion, or ultraviolet curable ink to model a three-dimensional object Obj, will be illustrated and described as a three-dimensional object modeling device.

Figure 1:
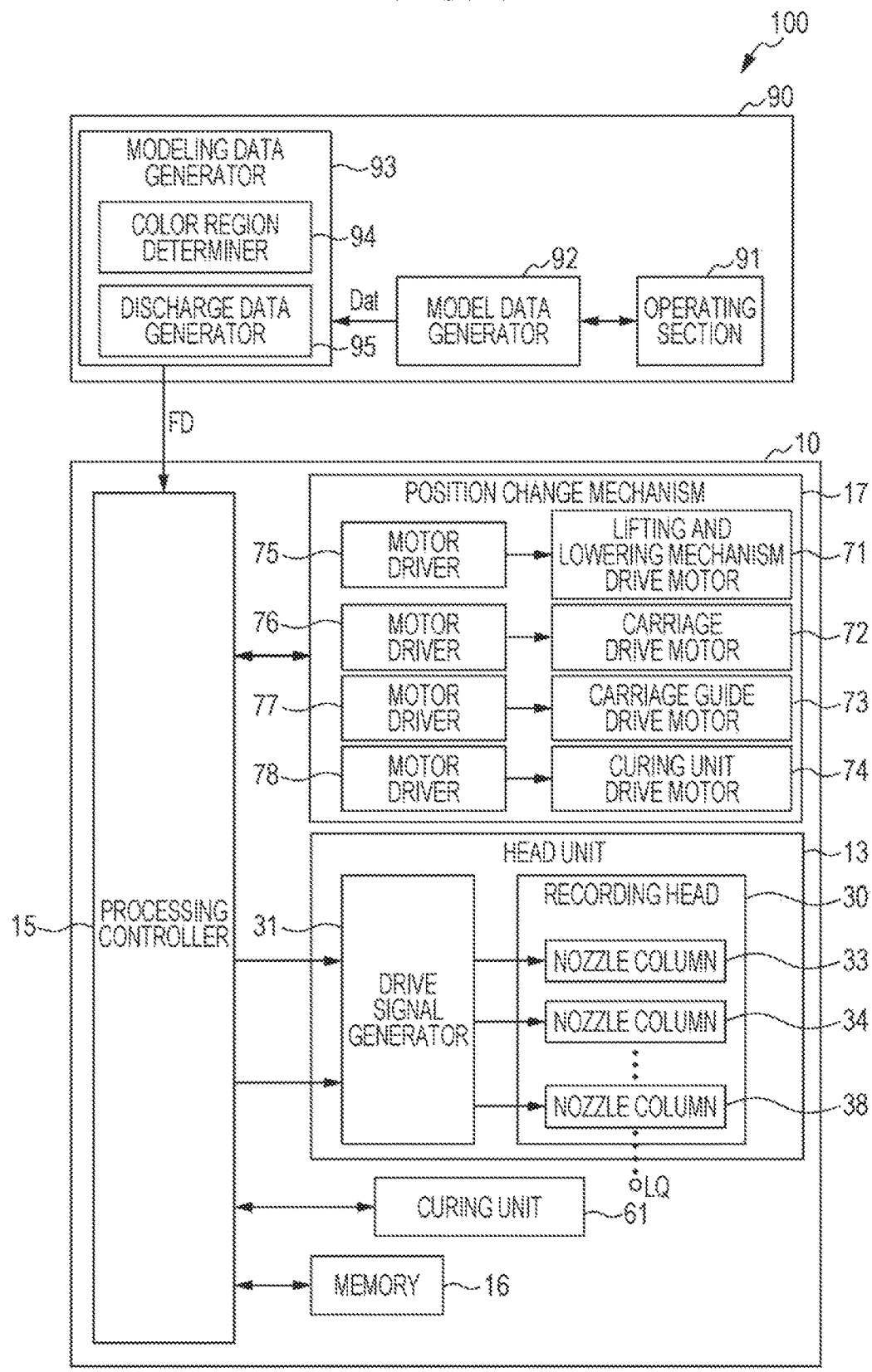
FIG. 1 is a functional block diagram illustrating the configuration of a three-dimensional object model system.

FIG. 1 is a functional block diagram illustrating the configuration of a three-dimensional object modeling system 100. As illustrated in FIG. 1, the three-dimensional object modeling system 100 includes a host computer 90 that generates data for modeling a three-dimensional object, and a three-dimensional object modeling device 10 that models a three-dimensional object. The three-dimensional object modeling device 10 discharges ink, forms a layered model body with a predetermined thickness using the dots formed by solidifying the discharged ink, and layers the model body, thereby performing model processing to model the three-dimensional object Obj. The host computer 90 executes data generation processing for generating modeling data FD that defines the shape and color of each of multiple model bodies included in the three-dimensional object Obj modeled by the three-dimensional object modeling device 10.

As illustrated in FIG. 1, the host computer 90 includes a CPU (not illustrated) that controls the operation of each component of the host computer 90, a display unit (not illustrated) such as a display, an operating part 91 such as a keyboard and a mouse, an information memory (not illustrated) that stores a control program of the host computer 90, a driver program of the three-dimensional object modeling device 10, and application programs, such as a computer aided design (CAD) software, a model data generator 92 that generates model data Dat, and a modeling data generator 93 that performs data generation processing for generating modeling data FD based on the model data Dat.

Here, the model data Dat is data that indicates the shape and color of a model representing the three-dimensional object Obj to be modeled by the three-dimensional object modeling device 10, and that is for specifying the shape and color of the three-dimensional object Obj. It is to be noted that hereinafter the color of the three-dimensional object Obj includes the manner in which the multiple colors are applied when multiple colors are applied to the three-dimensional object Obj, that is, patterns, characters, and other images represented by the multiple colors applied to the three-dimensional object Obj.

The model data generator 92 is a functional block that is implemented by executing an application program by the CPU of the host computer 90, the application program being stored in the information memory. The model data generator 92 is, for instance, a CAD application, and generates model data Dat which specifies the shape and color of the three-dimensional object Obj, based on information inputted via an operation of the operating part 91 by a user of the three-dimensional object model system 100.

It is to be noted that in this embodiment, it is assumed that the model data Dat specifies the external shape and the surface color of the three-dimensional object Obj. In other words, it is assumed that the model data Dat specifies the shape of the three-dimensional object Obj which is assumed to be hollow, that is, the contour shape of the three-dimensional object Obj. For instance, when the three-dimensional object Obj is a sphere, the model data Dat indicates the spherical shape that is the contour of the sphere. However, the invention is not limited to such aspects and it is sufficient that the model data Dat include information that can identify at least the external shape of the three-dimensional object Obj. For instance, in addition to the external shape and color of the three-dimensional object Obj, the model data Dat may specify the internal shape and material of the three-dimensional object Obj. For instance, a data format, such as an additive manufacturing file format (AMF) and a standard triangulated language (STL) can be exemplified as the model data Dat.

The model data generator 93 is a functional block that is implemented by executing a driver program of the three-dimensional object modeling device 10 by the CPU of the host computer 90, the driver program being stored in the information memory. The model data generator 93 is a model region determiner, and performs data generation processing for generating modeling data FD that defines the shape and color of a model body to be formed by the three-dimensional object modeling device 10, based on the model data Dat generated by the model data generator 92.

In the following, it is assumed that the three-dimensional object Obj is modeled by layering Q layered model bodies (Q is a natural number satisfying Q 2). Also, in the following, processing of forming a model body performed by the three-dimensional object modeling device 10 is referred to as layer processing. In other words, model processing for modeling the three-dimensional object Obj performed by the three-dimensional object modeling device 10 includes the layer processing for Q times.

In order to generate Q pieces of modeling data FD that define the shape and color of Q model bodies each having a predetermined thickness, the model data generator 93 first generates sectional model data that has a one-to-one correspondence with each model body by slicing a three-dimensional shape indicated by the model data Dat every predetermined thickness Lz. Here, the sectional model data is data that indicates the shape and color of each section body obtained by slicing the three-dimensional shape indicated by the model data Dat. However, the sectional model data may be data that includes the shape and color of the section when the three-dimensional shape indicated by the model data Dat is sliced. The thickness Lz corresponds to the length of the dots formed by solidifying ink in the height direction.

Next, in order to form a model body corresponding to the shape and color indicated by the sectional model data, the model data generator 93 determines the arrangement of dots to be formed by the three-dimensional object modeling device 10, and outputs a result of the determination as the model data. In other words, the modeling data FD refers to data that, when the shape and color indicated by the sectional model data are expressed as a set of dots by subdividing the shape and color into a lattice, specifies the type of ink for forming each of multiple dots. The modeling data FD may include data that indicates the size of dots. Here, each dot is a three-dimensional object that is formed by solidifying the ink discharged at a time. In this embodiment, for the sake of convenience, each dot is a rectangular parallelepiped or a cube that has a predetermined thickness Lz and a predetermined volume. Also, in this embodiment, the volume and size of each dot are determined by factors including a pitch of the nozzle through which ink is discharged, a discharge interval of ink, and a viscosity of ink.

The model data generator 93 includes a color region determiner 94, and a discharge data generator 95. The color region determiner 94 determines a region in which dots formed by the coloring ink are arranged among the dots to be formed by the three-dimensional object modeling device 10. The color region determiner 94 determines a color region in which coloring is performed by discharging coloring ink to the surface of a set of dots formed by modeling ink, so as to reduce the difference in the depth in a normal direction of the surface of the three-dimensional object Obj. For instance, it is assumed that the variation in the depth from the surface of a color region is constant. How to determine a color region will be described later.

The discharge data generator 95 generates modeling ink discharge data for discharging modeling ink, and coloring ink discharge data for discharging coloring ink.

As described above, the model data Dat according to this embodiment specifies the external shape (contour shape) of the three-dimensional object Obj. For this reason, when a three-dimensional object Obj in the shape indicated by the model data Dat is faithfully modeled, the shape of the three-dimensional object Obj is a hollow shape with the only contour having no thickness. However, when a three-dimensional object Obj is modeled, it is preferable to determine the shape inside the three-dimensional object Obj in consideration of the strength of the three-dimensional object Obj. Specifically, when a three-dimensional object Obj is modeled, it is preferable that part or all of the inside of the three-dimensional object Obj have a solid structure. For this reason, the model data generator 93 according to this embodiment generates modeling data FD indicating that part or all of the inside of the three-dimensional object Obj has a solid structure regardless of whether or not the shape specified by the model data Dat is a hollow shape.

It is to be noted that depending on the shape of the three-dimensional object Obj, no dot is present in the (n−1)th layer which a lower layer of the dots in the nth layer. In such a case, even when a dot in the nth layer is attempted to be formed, the dot may fall downward. Thus, when "q≥2", in order to form a dot for constructing a model body at a position where the dot is to be formed originally, it is necessary to provide a supporter below the dot for supporting the dot. In this embodiment, similarly to the three-dimensional object Obj, a supporter is formed by dots composed of solidified ink. Thus, in this embodiment, in addition to the three-dimensional object Obj, the modeling data FD includes data for forming dots to form a supporter which is necessary when the three-dimensional object Ob is modeled. That is, in this embodiment, the model body includes both a portion in the three-dimensional object Obj to be formed by the qth layer processing, and a portion in the supporter to be formed by the qth layer processing. In other words, the modeling data FD includes data in which the shape and color of a portion formed as a model body in the three-dimensional object Obj are represented as a set of dots, and data in which the shape of a portion formed as a model body in the supporter are represented as a set of dots. The model data generator 93 according to this embodiment determines whether or not a supporter has to be provided for forming dots, based on the sectional model data or the model data Dat. When a result of the determination is affirmative, the model data generator 93 generates modeling data FD for providing a supporter, in addition to the three-dimensional object Obj. It is to be noted that it is preferable that the supporter be composed of a material that can be easily removed after the formation of the three-dimensional object Obj, for instance, water-soluble ink. The ink for forming dots used for the supporter is called "support ink".

Figure 2:
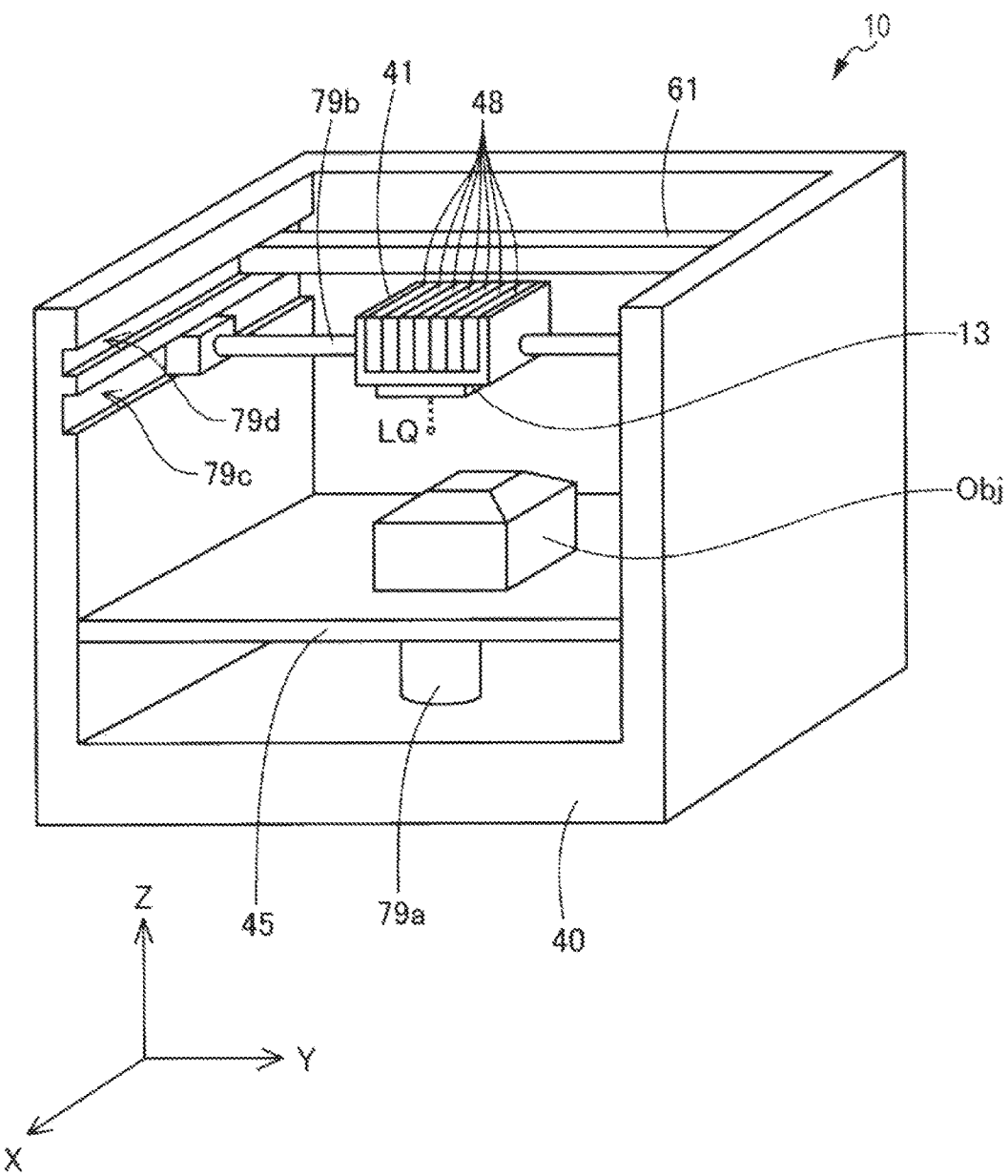
FIG. 2 is a perspective view schematically illustrating the internal structure of a three-dimensional object modeling device.

FIG. 2 is a perspective view schematically illustrating the internal structure of the three-dimensional object modeling device 10. Hereinafter, a description is given with reference to FIG. 1 in addition to FIG. 2. As illustrated in FIGS. 1 and 2, the three-dimensional object modeling device 10 includes a housing 40, a model table 45, a processing controller 15 (an example of "model controller") that controls the operation of each component of the three-dimensional object modeling device 10, a head unit 13, a curing unit 61, a carriage 41, a position change mechanism 17, and a memory 16 that stores a control program of the three-dimensional object modeling device 10 and other various pieces of information. The carriage 41 is equipped with the head unit 13 and six ink cartridges 48. The head unit 13 includes a recording head 30 including nozzle columns 33 to 38, and discharges ink liquid droplet LQ to the model table 45 through the nozzle columns 33 to 38. The curing unit 61 is for curing the ink discharged onto the model table 45. The position change mechanism 17 changes the positions of the carriage 41, the model table 45, and the curing unit 61 with respect to the housing 40. The processing controller 15 and the model data generator 93 each serve as a system controller that controls the operation of each component of the three-dimensional object model system 100.

The curing unit 61 is a component that cures the ink discharged onto the model table 45, and for instance, a light source for irradiating ultraviolet curing ink with ultraviolet rays, and a heater for heating resin ink can be illustrated. When the curing unit 61 is a light source of ultraviolet rays, the curing unit 61 is provided, for instance, on the upper side (in +Z direction) of the model table 45. On the other hand, when the curing unit 61 is a heater, the curing unit 61 may be provided, for instance, on the inner side of the model table 45 or on the lower side of the model table 45. Hereinafter, a description is given under the assumption that the curing unit 61 is a light source of ultraviolet rays and the curing unit 61 is positioned in +Z direction of the model table 45.

Six ink cartridges 48 are provided to have a one-to-one correspondence with totally six types of ink of the modeling ink with five colors for modeling the three-dimensional object Obj, and supporting ink (support ink) for forming a supporter. Each of the ink cartridges 48 is filled with ink of a type corresponding to the ink cartridge 48. The modeling ink with five colors for modeling the three-dimensional object Obj includes chromatic color ink (also called "coloring ink") having a chromatic color material component, achromatic color ink having an achromatic color material component, and clear (CL) ink having a less content of color material component per unit weight or unit volume as compared with the chromatic color ink and the achromatic color ink. In this embodiment, inks in three colors of cyan (CY), magenta (MG), and yellow (YL) are used as the chromatic color ink. Also, in this embodiment, ink of white (WT) is used as the achromatic color ink. The white ink according to this embodiment is an ink that, when the white ink is irradiated with light having a wavelength belonging to a wavelength range (approximately 400 nm to 700 nm) of visible light, reflects light with a predetermined ratio or higher in the light with which the white ink is irradiated. It is to be noted that "reflects light with a predetermined ratio or higher" is synonymous with "absorbs or transmits light with less than a predetermined ratio", and refers to a situation when a ratio of the quantity of light reflected by the white ink to the quantity of light with which the white ink is irradiated is higher than or equal to a predetermined ratio, for instance. In this embodiment, the "predetermined ratio" may be, for instance, any ratio 30% or higher and 100% or lower, and is preferably any ratio of 50% or higher, and is more preferably any ratio of 80% or higher. In this embodiment, the clear ink is a highly transparent ink having a less content of color material component as compared with the chromatic color ink and the achromatic color ink.

It is to be noted that each ink cartridge 48 may be provided somewhere else in the three-dimensional object modeling device 10 other than in the carriage 41.

As illustrated in FIGS. 1 and 2, the position change mechanism 17 includes a lifting and lowering mechanism drive motor 71, carriage drive motors 72, 73, a curing unit drive motor 74, and motor drivers 75 to 78. The position change mechanism 17 receives an instruction from the processing controller 15, and drives a model table lifting and lowering mechanism 79a that lifts and lowers the model table 45 in +Z direction and −Z direction (hereinafter, +Z direction and −Z direction may be collectively referred to as the "Z-axis direction"). The carriage drive motor 72 receives an instruction from the processing controller 15, and moves the carriage 41 along a guide 79b in +Y direction and −Y direction (hereinafter, +Y direction and −Y direction may be collectively referred to as the "Y-axis direction"). The carriage drive motor 73 receives an instruction from the processing controller 15, and moves the carriage 41 along a guide 79c in +X direction and −X direction (hereinafter, +X direction and −X direction may be collectively referred to as the "X-axis direction"). The curing unit drive motor 74 receives an instruction from the processing controller 15, and moves the curing unit 61 along a guide 79d in +X direction and −X direction. The motor driver 75 drives the lifting and lowering mechanism drive motor 71, the motor drivers 76, 77 drive the carriage drive motors 72, 73, and the motor driver 78 drives the curing unit drive motor 74.

The head unit 13 includes a recording head 30 and a driving signal generator 31. The driving signal generator 31 receives an instruction from the processing controller 15, and generates various signals including a driving waveform signal for driving the recording head 30, and a waveform specification signal, and outputs these generated signals to the recording head 30. A description of the driving signal generator 31 and the driving waveform signal will be omitted.

Figure 3:
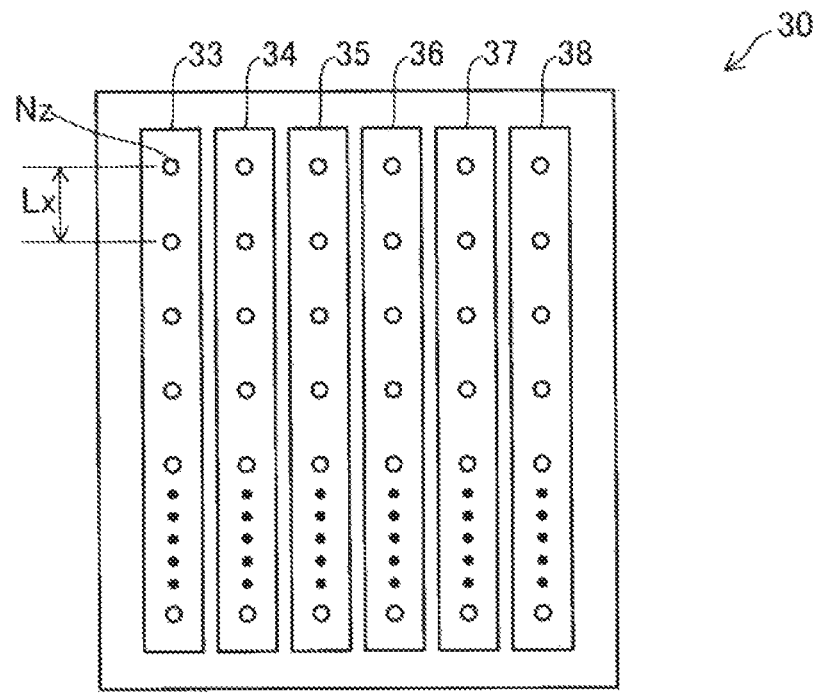
FIG. 3 is an explanatory diagram illustrating a recording head.

FIG. 3 is an explanatory diagram illustrating the recording head 30. The recording head 30 includes six nozzle columns 33 to 38. Each of the nozzle columns 33 to includes multiple nozzles Nz provided at intervals of pitch Lx. The nozzle columns 33 to 35 have nozzles Nz for discharging the chromatic color inks (cyan, magenta, yellow) each of which is coloring ink. The nozzle column 36 has nozzles Nz for discharging ink of white (also called "white ink") which is achromatic color ink, and ink in black. The nozzle column 37 has nozzles Nz for discharging of clear ink. The nozzle column 38 has nozzles Nz for discharging the support ink. Here, all inks except the support ink are used as the modeling ink, and the chromatic color ink and the white ink are used as the coloring ink. Therefore, the first nozzle, through which the modeling ink is discharged, includes the nozzles Nz in the nozzle columns 33 to 37, and the second nozzle, through which the coloring ink is discharged, includes the nozzles Nz in the nozzle columns 33 to 36.

In this embodiment, as illustrated in FIG. 3, the nozzles Nz in the nozzle columns 33 to 38 are arranged so as to be aligned in a row in the X-axis direction. However, for instance, part of the nozzles Nz (for instance, even-numbered nozzles Nz) and the other part of the nozzles Nz (for instance, odd-numbered nozzles Nz) may be at different positions in the Y-axis direction, that is, so-called in a staggered configuration among multiple nozzles Nz included in the nozzle columns 33 to 38. Also, the interval (pitch Lx) between nozzles Nz in the nozzle columns 33 to 38 may be set as appropriate according to a dot per inch (DPI).

The processing controller 15 includes a central processing unit (CPU) and a field-programmable gate array (FPGA), and controls the operation of each component of the three-dimensional object modeling device 10 by operating the CPU in accordance with the control program stored in the memory 16. The memory 16 includes an electrically erasable programmable read-only memory (EEPROM) which is a type of a non-volatile semiconductor memory that stores the modeling data FD supplied from the host computer 90; a random access memory (RAM) that temporarily stores data necessary for performing various types of processing, such as model processing to model a three-dimensional object Obj, or allows a control program for controlling each component of the three-dimensional object modeling device 10 to be temporarily loaded so as to perform various types of processing, such as the model processing; and a PROM which is a type of a non-volatile semiconductor memory that stores control programs.

The processing controller 15 controls the operation of the head unit 13 and the position change mechanism 17 based on the modeling data FD supplied from the host computer 90, thereby controlling the execution of the model processing to model the three-dimensional object Obj on the model table 45 according to the model data Dat. Specifically, the processing controller 15 first stores the model data FD supplied from the host computer 90 in the memory 16. Next, the processing controller 15 controls the driving signal generator 31 of the head unit 13, generates various signals including a driving waveform signal for driving the recording head 30 and a waveform specification signal, and outputs these generated signals to the recording head 30, based on various types of data such as the modeling data FD stored in the memory 16. Also, the processing controller 15 generates various signals for controlling the motor drivers 75 to 78, outputs these generated signals to the motor drivers 75 to 78, and controls the relative position of the head unit 13 with respect to the model table 45, based on various types of data such as the modeling data FD stored in the memory 16.

In this manner, the processing controller 15 controls the relative position of the head unit 13 with respect to the model table 45 via control of the motor drivers 75, 76, and 77, and controls the relative position of the curing unit 61 with respect to the model table 45 via control of the motor drivers 75 and 78. In addition, the processing controller 15 controls presence and absence of discharge of ink through the nozzles Nz, the amount of discharge of ink, and the timing of discharge of ink via control of the head unit 13. Thus, the processing controller 15 forms dots on the model table 45 while adjusting the size of dots and arrangement of dots which are formed by the ink discharged onto the model table 45, and controls the execution of layer processing for forming a model body by curing the dots formed on the model table 45. In addition, the processing controller 15 repeatedly performs the layer processing to layer a new model body on a model body already formed, thereby controlling the execution of model processing for forming a three-dimensional object Obj corresponding to the model data Dat.

Figure 4:
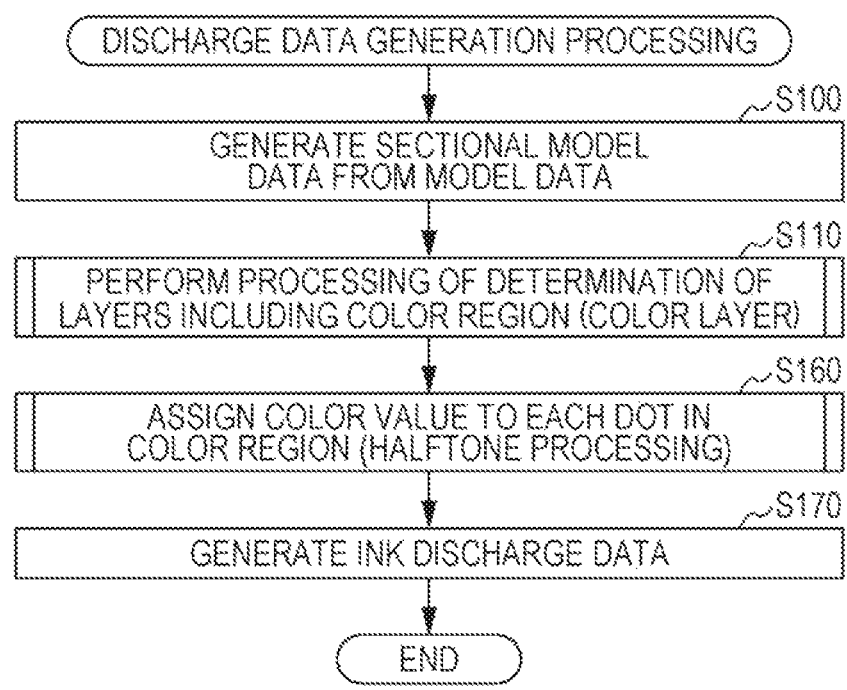
FIG. 4 is a flowchart of generation of ink discharge data executed by a CPU of a host computer.

FIG. 4 is a flowchart of generation of ink discharge data executed by the CPU of the host computer 90. The processing is executed by a CPU corresponding to the model data generator 93, after the model data Dat is created by the model data generator 92 of the host computer 90. When the processing is started, in step S100, the model data generator 93 generates sectional model data from the model data Dat. In step S110 subsequent to step S100, the region determiner 94 determines a color region. Specifically, the color region determiner 94 determines dots DT to be composed of coloring ink among the dots DT included in each layer. It is to be noted that the color region determiner 94 determines not only a color region, but also a transparent layer, a shield layer, and a model layer.

Figure 5:
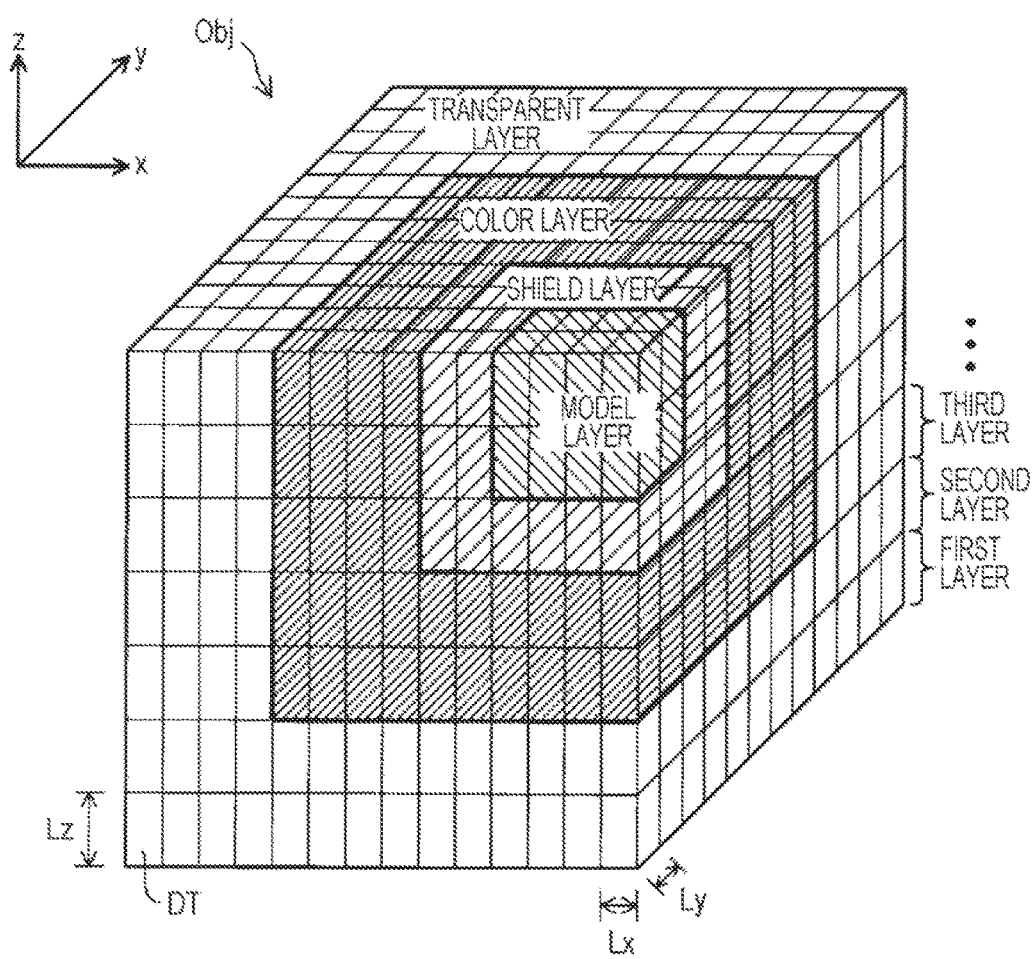
FIG. 5 is an explanatory diagram illustrating part of a three-dimensional object when the three-dimensional object is cut along the xy plane.
Figure 6:
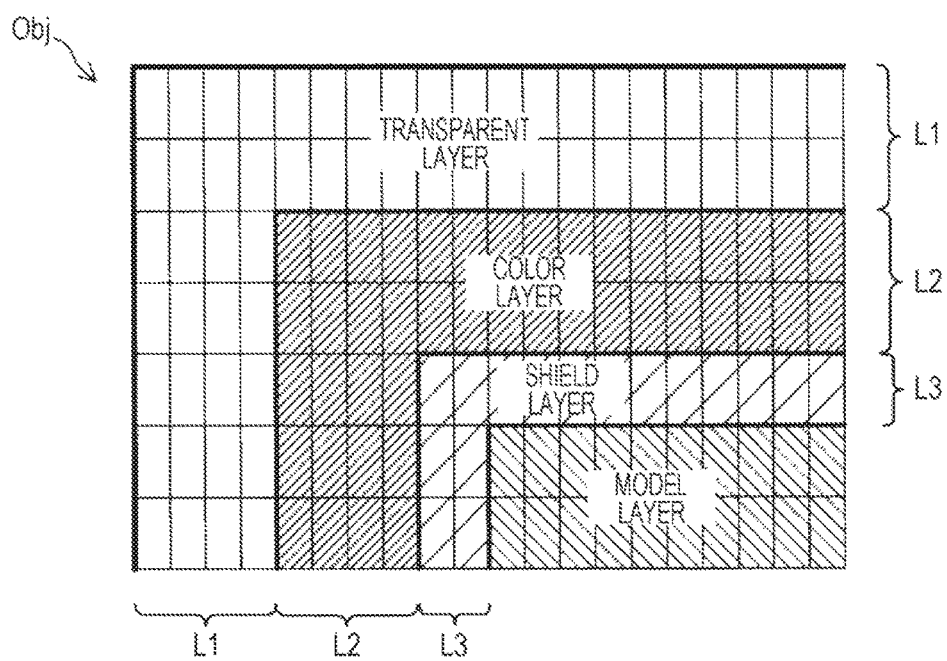
FIG. 6 is an explanatory diagram illustrating part of a section when the three-dimensional object is cut along the xz plane.

FIG. 5 is an explanatory diagram illustrating part of the three-dimensional object Obj when the three-dimensional object Obj is cut along the xy plane. FIG. 6 is an explanatory diagram illustrating part of a section when the three-dimensional object is cut along the xz plane. The model data generator 93 forms the shape of the three-dimensional object Obj as a set of dots DT each having a three-dimensional shape with length, width, height of Ly, Lx, Lz. In this embodiment, Ly:Lx:Lz is equal to 1:1:2. Here, Lx is the length of each dot DT in the x direction, and is equal to the pitch of the nozzles Nz. Ly is the length of each dot DT in the y direction, and is equal to a movement length of the recording head 30 according to a discharge interval of ink. Lz is equal to the length of each dot DT in the z direction. Lz is determined by the viscosity and amount of ink of which each dot is composed. The sectional model data of each layer is formed, for instance, as a set of dots DT disposed two-dimensionally in the x direction and the y direction. It is to be noted that each dot DT forms one of the later-described transparent layer, color layer (color region), shield layer, and model layer.

The three-dimensional object Obj has a model layer at the center. The model layer forms the main shape of the three-dimensional object Obj. The model layer may be formed using any ink other than the support ink. A shield layer is formed on the surface of the model layer. The shield layer is for shielding the model layer to make the color thereof invisible, and is composed of white ink. The thickness of the shield layer is L3. A color layer is formed on the surface of the shield layer. The color layer is a color region, and a color is applied to the three-dimensional object Obj. The color layer is composed of chromatic color ink and white ink. Here, when the gradation of the chromatic color ink is low, a region, to which the chromatic color ink is not applied, may occur. Since the chromatic color ink also forms the shape, a shape loss may occur in the region to which the chromatic color ink is not applied. The white ink fills the region to which the chromatic color ink is not applied, and reduces the possibility of occurrence of a shape loss. It is to be noted that clear ink may be used instead of the white ink. The thickness of the color layer is L2. A transparent layer is for protecting the color layer, and is composed of the clear ink which is a transparent ink. The thickness of the transparent layer is L1. It is to be noted that the transparent layer may not be provided.

Figure 7:
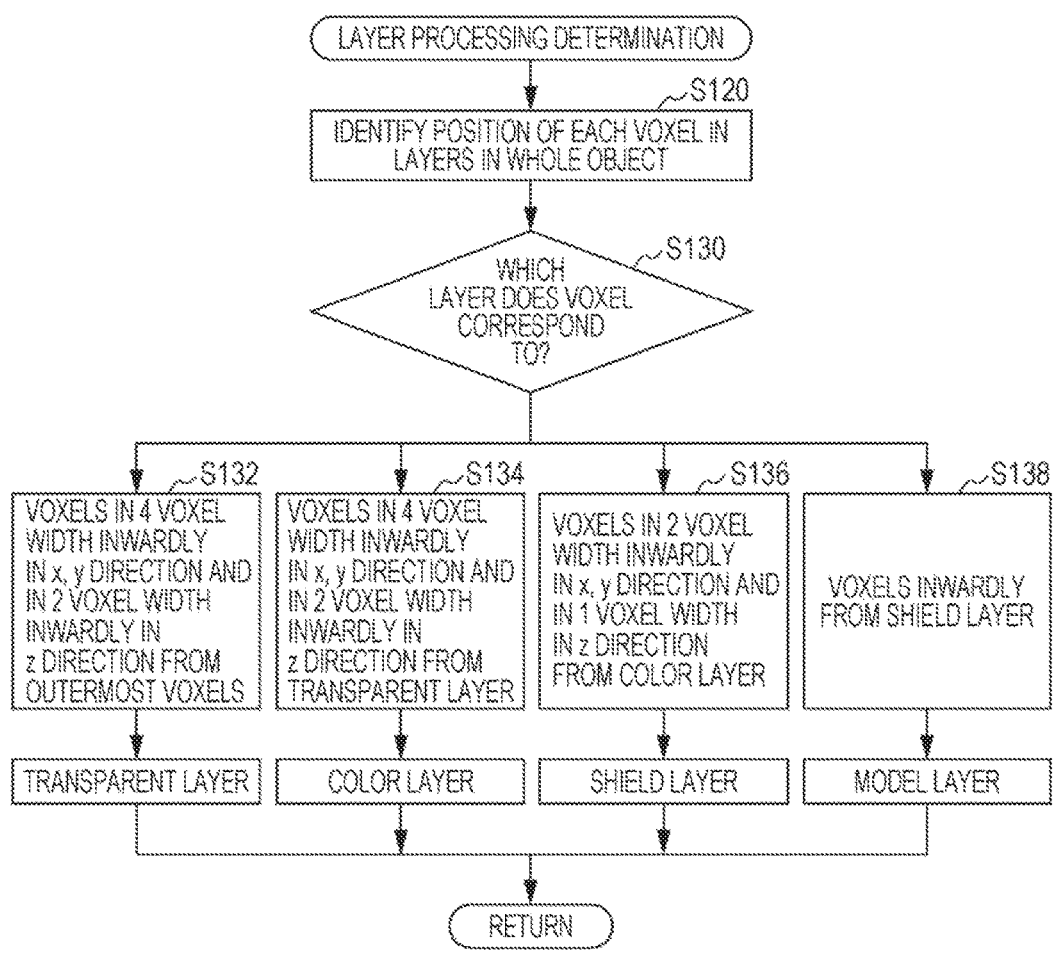
FIG. 7 is a flowchart illustrating an example of processing when a color region determiner determines a transparent layer, a color layer, a shield layer, and a model layer in step S110 of FIG. 4.

FIG. 7 is a flowchart illustrating an example of processing when the color region determiner 94 determines a transparent layer, a color layer, a shield layer, and a model layer in step S110 of FIG. 4. In step S120, the color region determiner 94 identifies the position of each voxel in each layer in the whole three-dimensional object Obj. The position of each voxel can be identified in terms of the number of voxels in the x direction, the y direction, and the z direction from a reference voxel which is one of voxels. In the next step S130, the color region determiner 94 determines that each voxel is which one of a transparent layer, a color layer, a shield layer, and a model layer. Specifically, the color region determiner 94 determines a transparent layer, a color layer (color region), a shield layer, and a model layer in that order. In step S132, the color region determiner 94 determines that the voxels that form a transparent layer are defined by the region inwardly by length L1 from the outermost voxel, specifically, the voxels in 4 voxel width in the x, y direction, and the voxels in 2 voxel width in the z direction. The reason why the number of voxels in the z direction is half the number of voxels in the x, y direction is because Lx:Ly:Lz=1:1:2, and thus the length Lz of each voxel in the z direction is twice the length Lx of each voxel in the x direction and twice the length Ly of each voxel in the y direction. Subsequently, in step S134, the color region determiner 94 determines that the voxels that form a color layer are defined by the region inwardly by length L2 from the transparent layer, specifically, the voxels in 4 voxel width in the x, y direction, and the voxels in 2 voxel width in the z direction. Subsequently, in step S136, the color region determiner 94 determines that the voxels that form a shield layer are defined by the region inwardly by the length L2 from the color layer, specifically, the voxels in 2 voxel width in the x, y direction, and the voxels in 1 voxel width in the z direction. Subsequently, in step S138, the color region determiner 94 determines that the voxels that form a model layer are defined by the voxels inwardly of the shield layer. In this embodiment, the transparent layer, the color layer (color region), the shield layer, and the model layer are determined by the number of voxels, however, may be determined by a distance L1 from the contour, a distance L2 from the inner surface of the transparent layer, and a distance L3 from the inner surface of the color layer. The above-described processing determines the arrangement of voxels of the transparent layer, the color layer, the shield layer, and the model layer that form the three-dimensional object Obj indicated by the internal structure illustrated in FIGS. 5 and 6.

After the above processing, returning to FIG. 4, the CPU of the host computer 90 performs the processing in and after step S160. In step S160 of FIG. 4, the discharge data generator 95 performs halftone processing for assigning a color value to each dot in the color region for each layer. The halftone processing is approximately the same processing as the processing in a two-dimensional printer, and thus a description is omitted. The reason why the halftone processing is described as approximately the same processing is because the following points are different. In a two-dimensional printer, magenta, cyan, or yellow ink, which is a chromatic color ink, is to be assigned to a pixel. However, a dot may be present, to which an ink is unable to be assigned depending on the gradation of a chromatic color ink. Since a print medium is present for a two-dimensional printer, even when a dot is present, to which an ink is unable to be assigned, the problem of a shape loss does not occur. In contrast, in the three-dimensional object modeling device 10 in this embodiment, the coloring ink also forms the dot DT that is included in the shape of the three-dimensional object Obj. Thus, when a dot DT is present, to which the coloring ink is unable to be assigned, a loss occur in the three-dimensional shape. For this reason the discharge data generator 95 assigns white ink to a dot DT to which magenta, cyan, or yellow ink, that is, a chromatic color ink, is unable to be assigned. As described above, the discharge data generator 95 may assign clear ink instead of white ink. Also, the discharge data generator 95 identifies the number of dots in the coloring ink in the length, width, and height directions based on the three-dimensional shape of a dot in which the coloring ink is solidified, and generates discharge data of the coloring ink to be discharged for each layer. Since $Lx:Ly:Lz=1:1:2$ in this embodiment, the number of dots in the coloring ink in the length, and width directions is twice as many as the number of dots in the coloring ink in the height direction. Except for these points, the halftone processing is the same as the processing in a two-dimensional printer.

In step S170, the discharge data generator 95 generates modeling data FD to be sent to the three-dimensional object modeling device 10. The modeling data FD includes ink discharge data for discharging various types of ink including modeling ink discharge data for discharging the modeling ink (ink excluding the support ink), and coloring ink discharge data for discharging the coloring ink (chromatic color ink and white ink).

Figure 8:
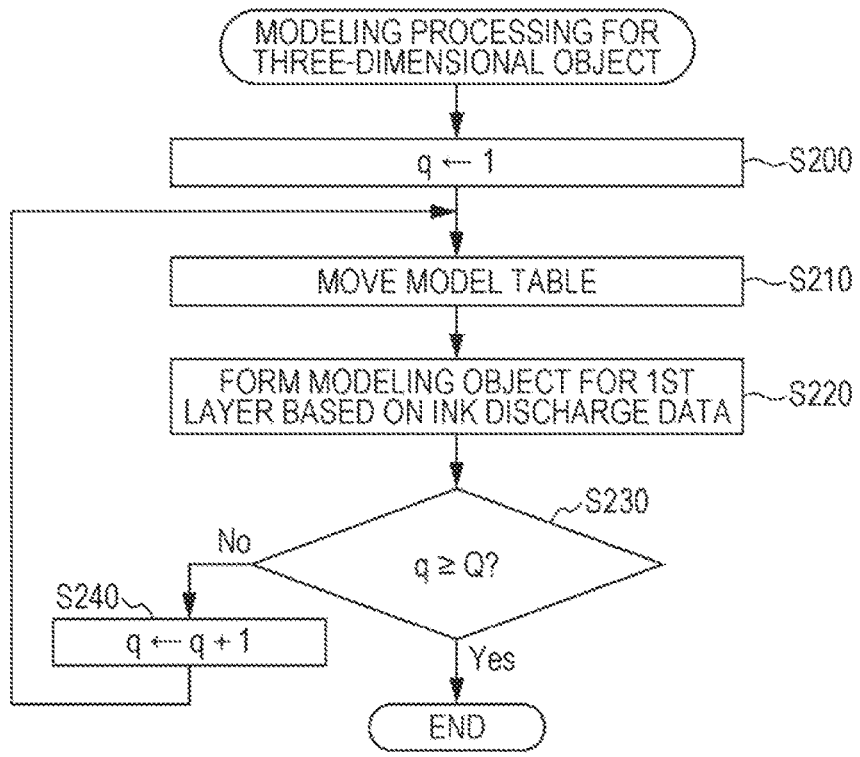
FIG. 8 is a flowchart illustrating model processing performed by the three-dimensional object modeling device.

The host computer 90 outputs the modeling data FD to the three-dimensional object modeling device 10 at a predetermined timing. FIG. 8 is a flowchart illustrating model processing performed by the three-dimensional object modeling device 10. The processing is started when the three-dimensional object modeling device 10 receives the modeling data FD from the host computer 90. When the processing of FIG. 8 is started, the processing controller 15 substitutes 1 for variable q (step S200), where q is a variable that indicates the current layer number, and q=1 indicates the 1st layer from the lower side in the z direction. In the subsequent step S210, the processing controller 15 instructs the position change mechanism 17 to move the model table 45 to a height at which a model body of the 1st layer is formed. In step S220, the processing controller 15 forms a model body of the 1st layer based on ink discharge data (modeling data FD). Specifically, the processing controller 15 forms dots DT by discharging various types of ink onto the model table 45 through the nozzles Nz of the nozzle columns 33 to 38, and subsequently, solidifying the ink using the curing unit 61. In step S230, the processing controller 15 determines whether or not q≥Q. Q is the number of model body layers that form the three-dimensional object Obj. When q≥Q, generation of all the model bodies of the 1st to Qth layers is ended, and so generation of the three-dimensional object Obj is completed, thus the processing controller 15 completes the processing. On the other hand, when q<Q, the flow proceeds to step S240, and 1 is added to the variable q and the flow proceeds to step S210. In step S210 for the second time or later, the position change mechanism 17 lowers the model table 45 by the height Lz of the dot DT. Subsequently, the flow proceeds to step S220, and the same processing is repeated until q≥Q is satisfied in step S230.

Figure 9:
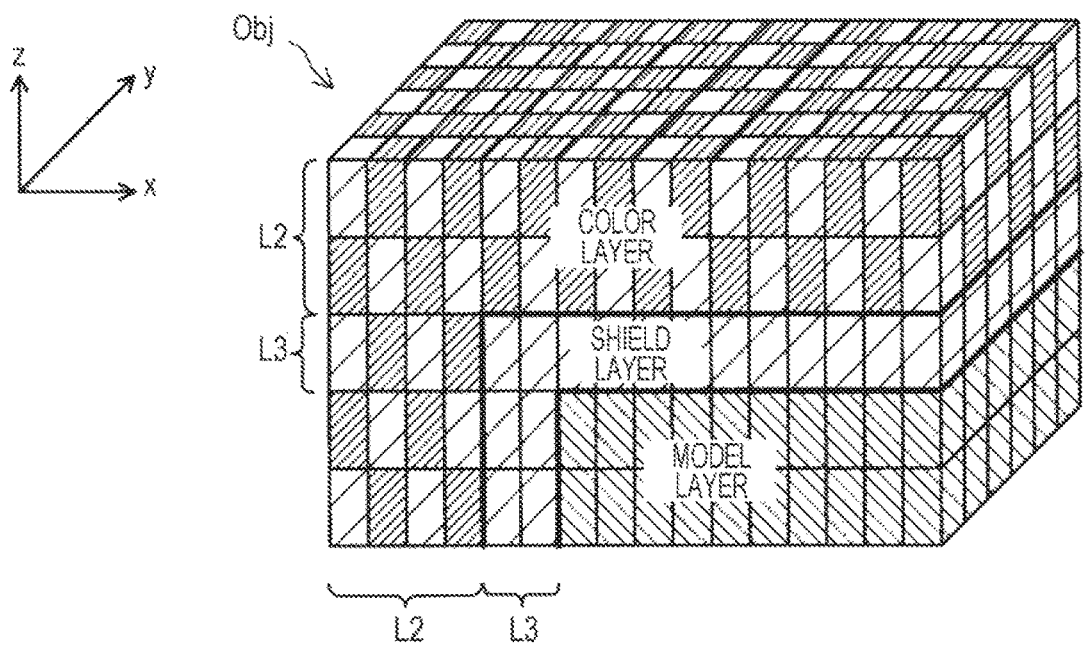
FIG. 9 is an explanatory diagram illustrating an example of a modeled three-dimensional object.

FIG. 9 is an explanatory diagram illustrating an example of a modeled three-dimensional object. FIG. 9 illustrates an example in which a transparent layer is not formed. In this example, the depth (depth from the surface of the three-dimensional object Obj) of the color layer in the x direction, and the z direction is L2 each. Although not clearly illustrated in FIG. 9, the depth of the color layer in the y direction is also L2. In this manner, when the color region to be colored by discharge of the coloring ink is formed so as to reduce the difference in the depth in a normal direction of the surface of the three-dimensional object Obj, the difference in color density can be reduced even when the direction of viewing the three-dimensional object is changed because the formation rate of a chromatic color ink in the volume of a unit area×depth L2 of the coloring layer does not change with the gradation of the same color even viewed in any of the x direction, the y direction, and the z direction. It is to be noted that in the example of FIG. 9, the formation rate of the chromatic color ink in the color layer is set to 50%. However, 50% formation rate of the chromatic color ink is an example, and even with another formation rate, similarly, the difference in color density can be reduced even when the direction of viewing the three-dimensional object is varied.

Figure 10:
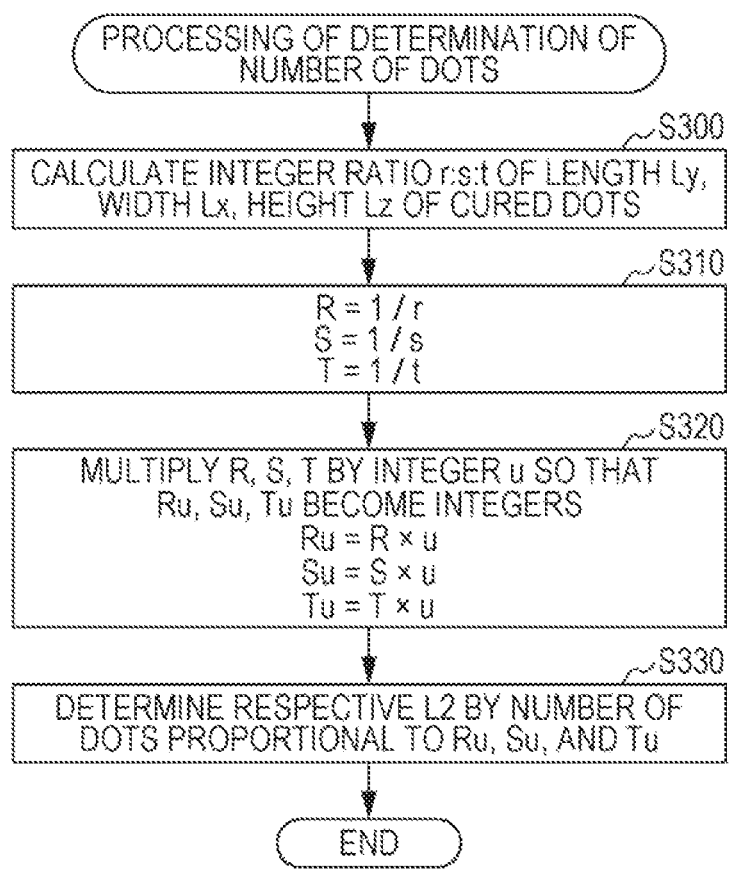
FIG. 10 is a flowchart for determining the number of dots in the transparent layer, the color layer, and the shield layer in the length, width, and height directions.

FIG. 10 is a flowchart for determining the number of dots in the transparent layer, the color layer, and the shield layer in the length, width, and height directions. The flow is executed by the developers of the manufacturing company of the three-dimensional object modeling device 10. In step S300, the developers of the manufacturing company measures the length Ly, width Lx, and height Lz of the three-dimensional shape of a solidified dot, and calculates an integer ratio r, s, t when the length Ly, width Lx, and height Lz are approximated by integers. It is preferable that each of the terms r, s, t be approximated by a single-digit integer. In step S310, R (=1/r), S(=1/s), and T(=1/t) are calculated. In step S320, R, S, and T are multiplied by an integer u so that Ru (=R×u), Su (=S×u), and Tu (=T×u) are integers. In step S330, the depth L2 of the color layer in the length, width, and height is determined by the number of dots proportional to Ru, Su, and Tu. In this manner, the number of dots of the depth of the color layer in the length, width, and height directions is determined by the number of dots which is inversely proportional to the magnitude of each term in an integer ratio by which the length, width, and height as the dot size of a dot formed by using the coloring ink are approximated. Thus, the depth from the surface of the color region can be easily made uniform regardless of the shape of a dot. Since the number of dots is an integer, the number of dots of the color layer in the x, y, and z directions can be easily determined when the number of dots is used. For instance, when Lx=1 μm, Ly=2 μm, and Lz=3 μm, based on these dimensions, the number of dots in the x direction, in the y direction, and in the z direction is calculated (specifically, 6 dots in the x direction, 3 dots in the y direction, and 2 dots in the z direction), and the number of dots which is an integral multiple of those can be the coloring layer. Other layers, that is, the transparent layer and the shield layer may be similarly determined.

In FIG. 10, when integer u is a common multiple of the terms r, s, t in an integer ratio r:s:t that approximates the length Ly, width Lx, and height Lz, Ru, Su, and Tu are integers. Therefore, the number of dots in the color region may be determined according to a value obtained by dividing the least common multiple of the terms in the integer ratio by each term in the integer ratio. When Lx=1 μm, Ly=2 μm, and Lz=3 μm, r:s:t is equal to 1:2:3, and the least common multiple of 1, 2, and 3 is 6. Thus value obtained by dividing the least common multiple of the terms in the integer ratio by each term in the integer ratio is 6, 3, and 2. Strictly speaking, the ratio of the length Ly, width Lx, and height Lz is not an integer ratio, thus an integer ratio obtained by approximating each of the length Ly, width Lx, and height Lz by an integer is used. It is to be noted that it is preferable that each term in the ratio of the length Ly, width Lx, and height Lz be approximated by a single-digit integer.

In the embodiment, the sectional model data for the 1st layer to the Qth layer is generated, and subsequently, modeling data is formed such that a predetermined number of voxels from the outside is sequentially is determined as the voxels for forming the transparent layer, the color layer, the shield layer, and the model layer. However, in the stage of the three-dimensional object Obj, the transparent layer may be determined to be in a range with a predetermined length L1 from the outside of the three-dimensional object Obj, and sequentially, the ranges of the color layer, the shield layer, and the model layer may be determined. Subsequently, the sectional model data for the 1st layer to the Qth layer may be generated, and the modeling data FD may be formed in consideration of the positions of the transparent layer, the color layer, the shield layer, and the model layer.

Figure 11:
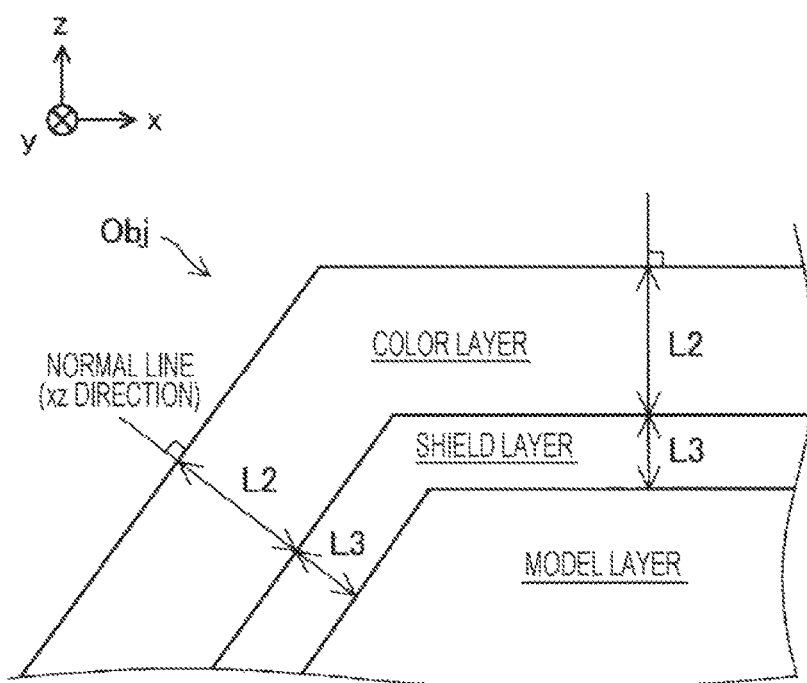
FIG. 11 is an explanatory diagram illustrating part of a section when the three-dimensional object is cut along the xz plane.

In the embodiment, the case has been described in which a normal line of the surface of the three-dimensional object Obj is the x direction, the y direction, or the z direction. However, as illustrated in FIG. 11, the present technique is applicable to a three-dimensional object Obj having a normal line in another direction. FIG. 11 illustrates a case in which a normal line of the surface of the three-dimensional object Obj is in the xz direction (a normal line is present on the xz plane) in addition to the z direction. In FIG. 11, when a normal line of the surface of the three-dimensional object Obj is not in the x direction, the y direction, or the z direction, the thickness of the color layer in the direction along a normal line is set to constant L2. In this manner, when the color layer is formed such that the thickness of the color layer in the direction along a normal line of the surface of the three-dimensional object Obj is a constant value L2 or a value approximated to L2, the difference in color density can be reduced even when the direction of viewing the three-dimensional object is varied. It is to be noted that the transparent layer is omitted in FIG. 11. Also, in FIG. 11, hatching is not shown because an auxiliary line indicating dimensions is hard to see.

Other Modifications

The present technique is applicable to a three-dimensional object modeling device that uses a liquid other than cyan ink, magenta ink, yellow ink, white ink, and clear ink, for instance. For instance, black ink, gray ink, metallic ink (ink that exhibits metallic luster) are also usable. It goes without saying that the present technique is also applicable to a three-dimensional object modeling device that does not use part of cyan ink, magenta ink, yellow ink, black ink, white ink, gray ink, metallic ink, and clear ink. Multiple types of dots formed by a dot formation unit may include dots with one of more colors of cyan, magenta, yellow, black, white, gray, and metallic color.

The ink discharged from the head unit may be a thermoplastic liquid such as a thermoplastic resin. In this case, the head unit may heat and discharge the liquid in a molten state. Also, the curing unit may be a section of the three-dimensional object modeling device, in which a dot with liquid from the head unit is cooled and solidified. In the present technique, "curing" includes "solidifying". Also, the modeling ink and the supporting ink may use liquids having different types of curing/solidifying process. For instance, an ultraviolet curable resin may be used for the modeling ink, and a thermoplastic resin may be used for the supporting ink.

The curing unit 61 may be mounted in the carriage.

A model processing device may forms a model layer by solidifying powder materials covered in layers using a curable liquid, and may model a three-dimensional object by stacking the formed model layer.

Also, the three-dimensional object modeling device is not limited to an ink jet device that discharges liquid and forms dots, and may be an optical model device that forms cured dots by irradiating a tank filled with an ultraviolet curable liquid resin with an ultraviolet laser, or a sintered powder lamination device that forms sintered dots by irradiating powder materials with a high-output laser beam.

Also, a configuration obtained by mutually replacing or changing a combination of the configurations disclosed in the example described above, and a configuration obtained by mutually replacing or changing a combination of a publicly known technique and the configurations disclosed in the example described above are also practicable. The invention also includes these configurations.

The entire disclosure of Japanese Patent Application No. 2017-062243, filed Mar. 28, 2017 is expressly incorporated by reference herein.

What is claimed is:

1. A three-dimensional object modeling device that uses ink which is solidified after being discharged and becomes part of a three-dimensional object as a three-dimensional dot, the three-dimensional object modeling device comprising:
   a first nozzle configured to discharge a modeling ink in the ink, the modeling ink being used for modeling the three-dimensional object;
   a second nozzle configured to discharge a coloring ink in the ink, the coloring ink being used for coloring the three-dimensional object;
   a model data generator that generates modeling data for the three-dimensional object;
   a model region determiner that determines a region to be modeled by layering the dot using the modeling ink discharged through the first nozzle, based on the modeling data;
   a color region determiner that determines a color region to be colored by discharging the coloring ink through the second nozzle, on a surface of a set of the layered dot with the modeling ink, based on the modeling data to reduce a difference in depth in a normal direction of a surface of the three-dimensional object;
   a discharge data generator that generates modeling ink discharge data for discharging the modeling ink, and coloring ink discharge data for discharging the coloring ink; and
   a processing controller that causes the modeling ink and the coloring ink to be discharged though the first and second nozzles, respectively, in accordance with the discharge data of the modeling ink and the coloring ink,
   wherein the color region determiner determines the depth from the surface of the color region as a number of dots which is inversely proportional to a magnitude of each term in an integer ratio by which a length, a width, and a height as a dot size of the dot formed by using the coloring ink are approximated.

2. The three-dimensional object modeling device according to claim 1,
wherein the color region determiner sets a uniform variation in the depth from the surface of the color region.

3. The three-dimensional object modeling device according to claim 1,
wherein the discharge data generator identifies the number of dots in the coloring ink discharged to the color region in a length direction, a width direction, and a height direction based on a three-dimensional shape of the dot after the coloring ink is solidified, and generates the discharge data of the coloring ink to be discharged for each of layers.

4. The three-dimensional object modeling device according to claim 1,
wherein the color region determiner determines the number of dots according to a value obtained by dividing a least common multiple of the terms in the integer ratio by each term in the integer ratio.

5. A method of modeling a three-dimensional object, the method comprising:
generating modeling data for the three-dimensional object;
determining a region to be modeled by layering a dot using a modeling ink based on the modeling data;
determining a color region to be colored by discharge of a coloring ink on a surface of a set of the layered dot with the modeling ink, based on the modeling data to reduce a difference in depth in a normal direction of a surface of the three-dimensional object;
generating modeling ink discharge data for discharging the modeling ink, and coloring ink discharge data for discharging the coloring ink; and
causing the modeling ink and the coloring ink to be discharged in accordance the discharge data of the modeling ink and the coloring ink, and performing modeling and coloring of the three-dimensional object,
wherein the depth from the surface of the color region is determined as a number of dots which is inversely proportional to a magnitude of each term in an integer ratio by which a length, a width, and a height as a dot size of the dot formed by using the coloring ink are approximated.

6. The method of modeling a three-dimensional object according to claim 5,
wherein a variation in the depth from the surface of the color region is set to be uniform.

7. The method of modeling a three-dimensional object according to claim 5,
wherein in the generating of the coloring ink discharge data, the number of dots in the coloring ink discharged to the color region in a length direction, a width direction, and a height direction is identified based on a three-dimensional shape of the dot after the coloring ink is solidified, and the discharge data of the coloring ink to be discharged for each of layers is generated.

8. The method of modeling a three-dimensional object according to claim 5,
wherein the number of dots is determined according to a value obtained by dividing a least common multiple of the terms in the integer ratio by each term in the integer ratio.

9. A non-transitory computer-readable medium including a control program for a three-dimensional object modeling device, the control program causing a computer to execute a process by a processor so as to perform the steps of:
generating modeling data for the three-dimensional object;
determining a region to be modeled by layering a dot using a modeling ink based on the modeling data;
determining a color region to be colored by discharge of a coloring ink on a surface of a set of the layered dot with the modeling ink, based on the modeling data to reduce a difference in depth in a normal direction of a surface of the three-dimensional object;
generating modeling ink discharge data for discharging the modeling ink, and coloring ink discharge data for discharging the coloring ink; and
causing the modeling ink and the coloring ink to be discharged in accordance the discharge data of the modeling ink and the coloring ink, and performing modeling and coloring of the three-dimensional object,
wherein the depth from the surface of the color region is determined as a number of dots which is inversely proportional to a magnitude of each term in an integer ratio by which a length, a width, and a height as a dot size of the dot formed by using the coloring ink are approximated.

10. The non-transitory computer-readable medium according to claim 9,
wherein a variation in the depth from the surface of the color region is set to be uniform.

11. The non-transitory computer-readable medium according to claim 9,
wherein in the generating of the coloring ink discharge data, the number of dots in the coloring ink discharged to the color region in a length direction, a width direction, and a height direction is identified based on a three-dimensional shape of the dot after the coloring ink is solidified, and the discharge data of the coloring ink to be discharged for each of layers is generated.

12. The non-transitory computer-readable medium according to claim 9,
wherein the number of dots is determined according to a value obtained by dividing a least common multiple of the terms in the integer ratio by each term in the integer ratio.

* * * * *